United States Patent [19]

Myer

[11] Patent Number: 5,896,065

[45] Date of Patent: Apr. 20, 1999

[54] RADIALLY COMBINED RF/MICROWAVE POWER AMPLIFIER

[76] Inventor: Daniel Myer, 780 Rutgers Rd., Franklin Square, N.Y. 11010

[21] Appl. No.: 08/870,256

[22] Filed: Jun. 6, 1997

[51] Int. Cl.[6] .................... H03F 3/68; H03F 3/60; H03F 1/30

[52] U.S. Cl. .................. 330/286; 330/289; 330/295

[58] Field of Search .................. 330/286, 287, 330/289, 295

[56] References Cited

U.S. PATENT DOCUMENTS

| | | |
|---|---|---|
| 4,429,286 | 1/1984 | Nichols et al. . |
| 4,463,326 | 7/1984 | Hom . |
| 4,641,106 | 2/1987 | Belohoubek et al. . |
| 4,931,747 | 6/1990 | Hom .................... 330/295 X |

*Primary Examiner*—James B. Mullins
*Attorney, Agent, or Firm*—Collard & Roe, P.C.

[57] ABSTRACT

A radially combined RF/Microwave amplifier includes an input divider for dividing the input power signal into "N" input signals, and a single matching/combiner circuit configuration for matching an combining the amplified "N" input signals into one combined output power signal $P_T$. The system utilizes a stripline/microstrip configuration of the matching/combiner circuitry and suspends this circuitry above one surface of an aluminum chill plate. The input stage of the amplifier is disposed on the opposite surface of the chill plate with the transistors connecting the input stage with the output network across the peripheral edge of the chill plate.

7 Claims, 3 Drawing Sheets

RADIALLY COMBINED RF/MICROWAVE POWER AMPLIFIER

BACKGROUND OF THE INVENTION

1. Field of the Invention

The present invention relates to amplifiers. More particularly, it relates to a radially combined RF/Microwave amplifier.

2. The Prior Art

U.S. Pat. No. 4,429,286 to Nichols et al., discloses a divider/combiner amplifier. The invention consists of dividing an incoming energy signal into parallel channels for amplification. Each channel is amplified with an FET or bipolar type transistor. The amplified channels are subsequently combined to provide the amplified signal to an output port. The channels are formed circumferentially around a cylinder using concentrically disposed slotted electrically conducting cylinders. Each channel acts independently and channels and confines the microwave energy during amplification. The inner and outer concentrically disposed conductors extend radially and longitudinally along the cylinder.

U.S. Pat. No. 4,641,106 to Belohoubek et al., discloses a radial power amplifier. The invention consists of an electrically conductive central disc member having a central axis and opposite planar sides. An input port for receiving a signal to be amplified couples the signal to the first of the flat sides of the central disc. A power splitter is coupled to the input port and has a first flat conductive member spaced from the first flat side of the central disc, and forms a first radial transmission line for conveying the signal from the input port. A radial transmission line to microstrip transition is provided for splitting the input signal into a first plurality of portions.

U.S. Pat. No. 4,463,326 to Horn, discloses a planar N-way combiner/divider for microwave circuits. The invention consists of a plurality of branch or input ports for receiving energy signals. The branch ports are coupled to each other using microstrip disposed on a dielectric. The microstrip includes ½ and ⅓ wave sections along the input branches for providing equal or same phase signals to the combining points.

SUMMARY OF THE INVENTION

The present invention provides a radially combined RF/Microwave amplifier that can produce output power up to 'N' times the output power of an individual transistor in a frequency range of 200 MHz to 20 GHz.

According to the invention, a radially combined RF/Microwave amplifier is provided where the matching/combiner network is embodied as a single structure built on stripline material or microstrip. A plurality of transistors (e.g., MOSFET, GAASFET, bipolar any suitable known type) each have their output or drain connected to one of the legs of stripline channels. Each pair of amplifiers then converges, via stripline, to a common output for producing a high energy high frequency output. The input to the transistors contains a low powered signal. When these amplifiers are ganged together, they will produce hundreds of watts of microwave power which can be used for satellite transmission, cellular telephone transmission, microwave heating, medical heating, etc.

A balancing resistor disposed between the legs of the stripline channels allows for balancing the circuits when they are combined. The DC voltage $V_{cc}$ provides DC power (i.e., generally 12 or 24 volts) to the transistors and is connected via a decoupling stub to the stripline. The stripline or microstrip is usually copper conductor that has been cemented or plated onto a solid aluminum chill plate using TEFLON (polytetrafluoroethylene) supports.

The aluminum chill plate includes coolant channels that are positioned beneath the input transistors. A liquid coolant is pumped through the chill plate during operation in order to absorb the heat generated by the transistors and carry it away from the amplifier. Flexible tubing externally connects the coolant channels with each other and the coolant feed and output.

It is therefore an object of the present invention to provide a radially combined RF/Microwave amplifier that has an output section that does not use printed circuit board materials.

It is another object of the invention to provide radially combined RF/Microwave amplifier that eliminates the use of interconnecting hardware and the losses associated therewith.

A further object of the invention is to provide a radially combined RF/Microwave amplifier that has enhanced efficiency characteristics.

Yet another object of the invention is to provide a radially combined RF/Microwave amplifier that has increased reliability and can be easily manufactured.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
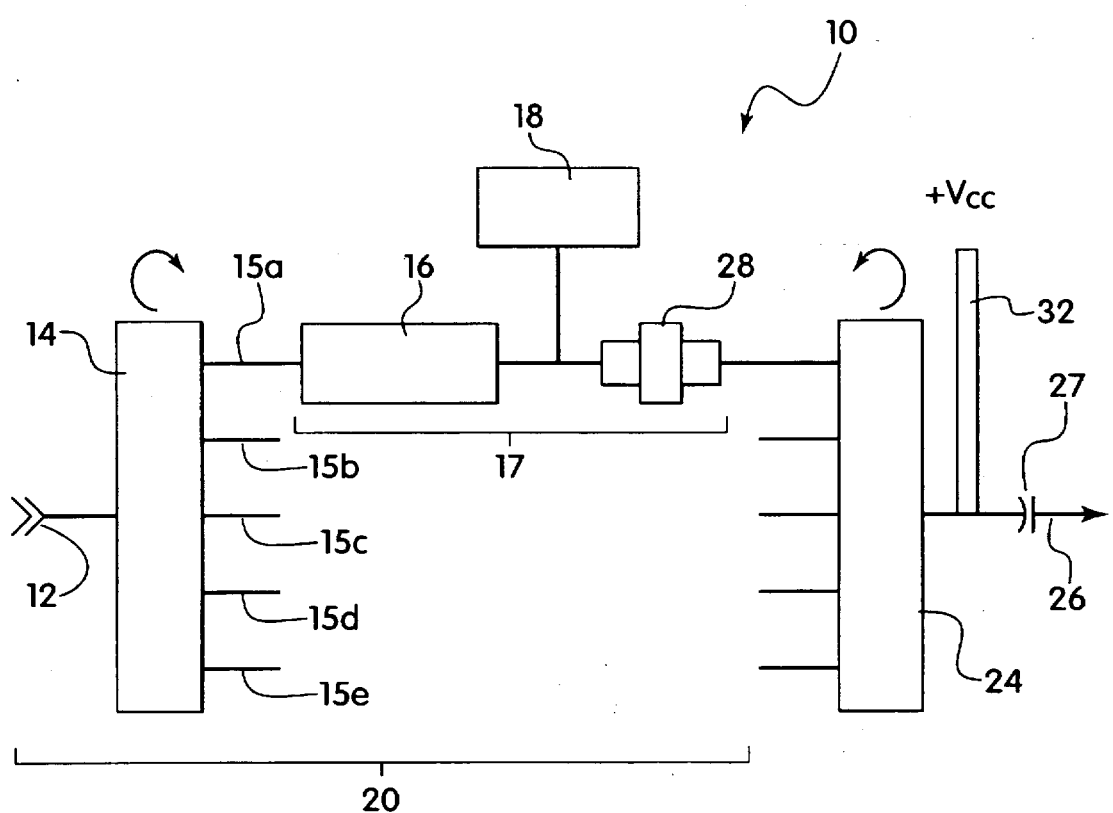
FIG. 1 is a block diagram of the radially combined RF/Microwave power amplifier according to the invention.

Turning now in detail to the drawings, FIG. 1 shows the radial amplifier 10 according to the invention. A radio frequency (RF)/microwave signal is applied to the signal input 12 where it enters an "N-way" radial power divider 14. This radial divider will divide the power of the input signal, $P_{in}$, into "N" output ports 15 where the power at each of these ports will be equal to $P_{in}/N$ (where $P_{in}$ is the power of the input signal). An amplifier stage 17 coupled to the output ports 15 is replicated "N" times, once for each output port of the divider.

The amplifier stage 17 includes an input impedance matching network 16 which matches the low input impedance of the transistor input to the impedance of the system (usually 50 ohms). A bias network 18 provides DC operating voltages necessary to turn on the input transistors for certain modes of operation. Solid state devices 28 are part of the amplifier stage and generally include input transistors. The transistors can be FET, MOS, GAASFET, MOSFET, Bipolar, or any other suitable solid state device for the desired application.

The input section 20 of this network including both the radial divider 14, input matching 16, and bias network 18 all consist of metalized foil circuitry etched onto TEFLON (polytetrafluoroethylene) based dielectric printed circuit board material.

The output matching/combiner 24 integrates both the output matching network and the radial output combiner into a single structure. This network function is the reciprocal of the input divider. The matching/combiner network 24 matches the low output impedance of the input transistors 28 to the system impedance of 50 ohms. The radial output combiner network combines the output power of individual amplifier stages into a total power $P_T$ ($P_T = N*P_d$.) where $P_d = P_{in} \times A$ which is the output power of each individual amplifier stage), where A equals the gain of an individual transistor. The decoupling stub 32 is used to deliver DC power to the input transistors 28 while blocking the passage of the signal into the DC power supply $V_{cc}$. Output capacitor 27 will pass the signal to the "signal output" 26 while blocking the DC power provided by the DC power supply.

Figure 2A:
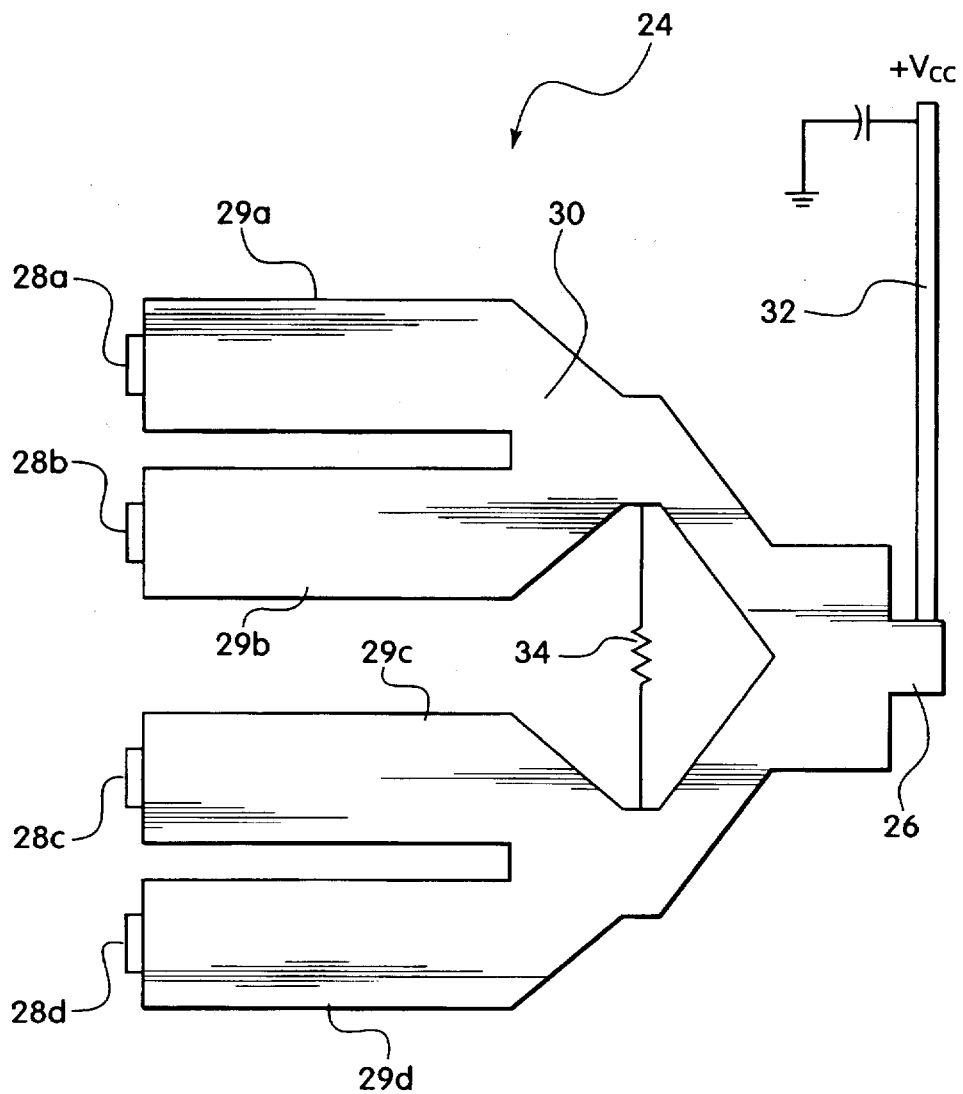
FIG. 2a is a top side cross sectional view of an output section of the radially combined RF/Microwave amplifier according to the invention.
Figure 2B:
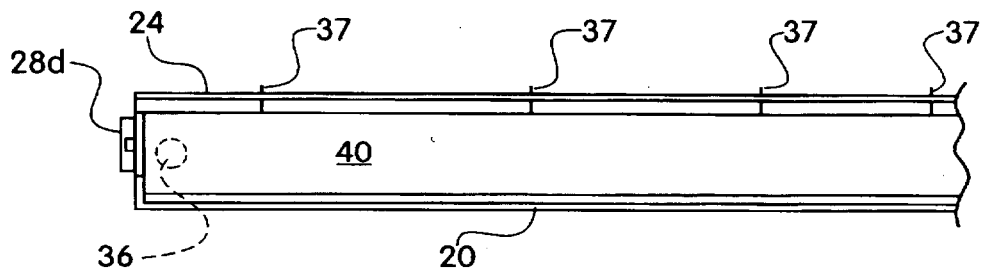
FIG. 2b is a side view of the output section according to the invention.

FIGS. 2a and 2b show the matching/combiner network 24 constructed out of a single sheet of machined or stamped metal material 30, such as microstripline. Each input leg 29a–d of the matching/combiner network 24 is coupled to an input transistor 28a–d, from the amplifier stage 17. Each leg 29a–29d has a length selected in accordance with the desired operating characteristics and frequency of the amplifier. For example, legs 29a–29d can have an electrical length in a range of ⅛λ to ¾λ (wavelength). A resistor 34 is provided between the two pairs of legs of the stripline to provide isolation between the circuits when they are combined.

FIG. 2b shows a side view of amplifier 10 according to the invention. The entire matching/combiner network 24 is suspended above an aluminum chill plate 40 by TEFLON (polytetrafluoroethylene) pins or supports 37. In this configuration, both the matching network and the radial combiner are integrated together. The input stage 20 is disposed on the opposing side of chill plate 40 and is coupled to the matching/combiner network 24 through the transistor 28 disposed on the periphery of chill plate 40. Chill plate 40 includes channels or groove 36 disposed in the vicinity of transistors 28 for the purpose of pumping a liquid coolant through the chill plate and absorbing the heat generated by transistors 28.

The output network 24 differs from the input network 20 in that it is devoid of any TEFLON (polytetrafluoroethylene) based printed circuit board material. The result is the elimination of dielectric losses incurred when using printed circuit boards. In addition, all interconnecting hardware and losses associated therewith are also eliminated.

Figure 3:
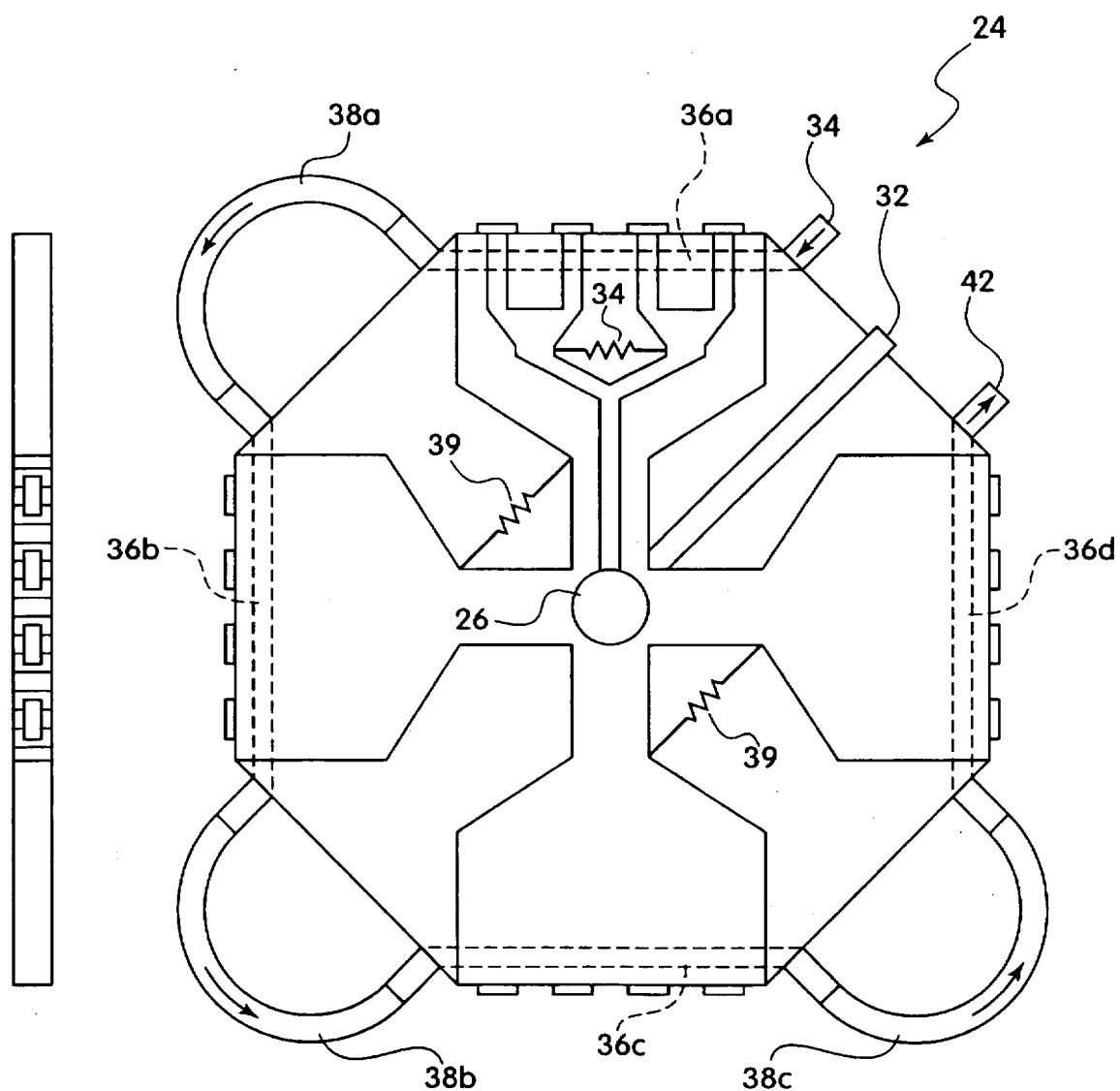
FIG. 3 is a schematic representation of the radially combined RF/Microwave amplifier according to the invention.

FIG. 3 shows a top view of the output section 24 of the radially combined amplifier of the invention. All stages feed into a central point where the power is combined at output 26. This point will generally be low in impedance and will need an impedance transformation to 50 ohms. All of the transistors 28 are mounted on the edge of the chill plate 40.

The chill plate is preferably a solid aluminum plate with channels 36a–36d milled into it adjacent to the transistors. A coolant input 34 feeds coolant to the system, and a coolant output 42 carries the coolant away from the amplifier. In this embodiment, flexible hoses 38a, 38b, and 38c are used to connect channels 36a, 36b, 36c and 36d into a single coolant conduit through the amplifier. The channels carry a liquid coolant through the amplifier to absorb the heat generated by the transistors and carry it away to a heat exhaust unit (not shown).

The DC operating power for the amplifier is provided by decoupling stub 32. Isolation resistors 39 are disposed between amplifier stages to isolate the respective signals from each other.

While one embodiment of the present invention has been shown and described, it is to be understood that many changes and modifications may be made thereunto without departing from the spirit and scope of the invention as defined in the appended claims.

What is claimed is:

1. A radially combined RF/Microwave amplifier comprising:

a chill plate having two opposing surfaces and a peripheral edge;

an input stage disposed on one of said two surfaces of said chill plate and adapted to receive an input power signal ($P_{in}$) and divide the input power signal into "N" input signals of equal value ($P_{in}/N$), said input stage having "N" outputs corresponding to the number of "N" input signals;

an amplifier stage coupled to each of said input stage outputs for amplifying each of said divided input signals ($P_{in}/N$);

an output network suspended above the other of said two surfaces and coupled to said amplifier stage across the peripheral edge of said chill plate, said output network being adapted to receive and combine the amplified "N" input signals ($A \times P_{in} \times N$) to produce a combined amplified signal ($P_T$) at its output.

2. The radially combined amplifier according to claim 1, wherein said output network is suspended from said chill plate by supports constructed of polytetrafluoroethylene (TEFLON) and further comprises:

a plurality of matching/combiner circuits having a plurality of microstrip legs each having one end coupled to one of said amplifier stages, and an opposite end converging with an adjacent microstrip leg to combine the amplified signals; and a balancing device disposed between each set of two pairs of microstrip legs and adapted to isolate the circuits when said microstrip legs are combined.

3. The radially combined amplifier according to claim 2, wherein said amplifier stages comprises transistors disposed on the peripheral edge of said chill plate, said output network being connected to said input stage through said transistors.

4. The radially combined amplifier according to claim 3, wherein said chill plate further comprises coolant channels adjacent the peripheral edges and adapted to receive a coolant liquid, the flow of liquid coolant through said channels absorbs heat generated by said transistors.

5. The radially combined amplifier according to claim 2, wherein each of said microstrip legs has an electrical length in a range of ⅛λ to ¾λ dependent on the frequency of the application.

6. The radially combined amplifier according to claim 1, wherein said input stage is comprises circuitry in the form of a dielectric printed circuit board.

7. The radially combined amplifier according to claim 2, wherein each of said plurality of matching/combiner circuits matches the output impedance of the transistors to the system impedance.

* * * * *